US006970008B2

United States Patent
Lu

(12) United States Patent
(10) Patent No.: US 6,970,008 B2
(45) Date of Patent: Nov. 29, 2005

(54) CHIP TESTING MACHINE WITH ROTARY CONVEYING DISK SET FOR RECEIVING AND CONVEYING THE CHIPS FOR TESTING

(75) Inventor: Ching-Lai Lu, Kaohsiung Hsien (TW)

(73) Assignee: All Ring Tech Co., Ltd., Kaohsiung Hsien (TW)

( * ) Notice: Subject to any disclaimer, the term of this patent is extended or adjusted under 35 U.S.C. 154(b) by 101 days.

(21) Appl. No.: 10/442,080

(22) Filed: May 21, 2003

(65) Prior Publication Data

US 2004/0232932 A1 Nov. 25, 2004

(51) Int. Cl.$^7$ .............................................. G01R 31/26
(52) U.S. Cl. ..................... 324/765; 324/754; 324/158.1
(58) Field of Search ................................ 324/754–765, 324/158.1; 209/556

(56) References Cited

U.S. PATENT DOCUMENTS 5,451,884 A * 9/1995 Sauerland ................... 324/760
6,218,852 B1 * 4/2001 Smith et al. ................. 324/761
6,710,613 B2 * 3/2004 Sauerland .................... 324/760

* cited by examiner

Primary Examiner—Paresh Patel
(74) Attorney, Agent, or Firm—Rosenberg, Klein & Lee

(57) ABSTRACT

A chip testing machine includes a testing mechanism for acquiring data of chips and sorting same into several different groups according to outcome of testing operation, a feeding mechanism for helping convey chips to the testing mechanism, and a second rotary conveying disk in addition to a first rotary conveying disk for helping increase efficiency of testing; the first and the second disks are juxtaposed, actuated to rotate synchronously in opposite directions by means of single common transmission device to receive chips conveyed from the feeding mechanism as well as to convey the chips to the testing mechanism for testing, and cooperate with respective delivering mechanisms for conveying chips to collecting sinks designated for respective ones of the different groups of chips after the chips have been tested.

3 Claims, 11 Drawing Sheets

CHIP TESTING MACHINE WITH ROTARY CONVEYING DISK SET FOR RECEIVING AND CONVEYING THE CHIPS FOR TESTING

BACKGROUND OF THE INVENTION

1. Field of the Invention

The present invention relates to a chip testing machine, more particularly one, which is comprised of two rotary conveying disks capable of being actuated by single common motor and cooperating with single feeding mechanism and single testing mechanism thereof to work more efficiently.

2. Brief Description of the Prior Art

With the progress of technology, highly efficient testing machines are available for various electronic parts of chips, e.g. inducers, capacitors, and resistors. Such testing machines can perform feeding, testing, sorting, and collecting of chips automatically, and in such a way as to ensure quality of the products delivered to the buyers.

Referring to FIG. 11, a conventional chip testing machine consists of a main shell 10, a control mechanism 101, a feeding mechanism 102, a rotary conveying disk 103, a testing mechanism 104, a delivering mechanism 105, and a several collecting sinks 106 all fitted to the main shell 10. Chips to be tested are spread out on the rotary conveying disk 103 via the feeding mechanism 102, and conveyed to the testing mechanism 104 by means of the conveying disk 103 such that upper and lower probes (not shown) of the testing mechanism 104 can come into contact with the chips in sequence to get various data related to the chips and sort the chips into different groups according to the acquired data. At last, the chips are conveyed to the delivering mechanism 105 from the disk 103, and guided to appropriate ones of the collecting sinks 106 by means of the delivering mechanism 105.

Rotary conveying disks for chip testing machines are usually formed with several trenches for holding more chips in position for heightening efficiency of the machines. And, the upper and the lower probes are adjustable in distance in between according to the sizes of chips to be tested so that they can contact chips of different sizes all in a proper way.

However, as chips are made smaller and smaller in size, chip testing machines of such kind are faced with problems as followings:

1. Chips are made further and further minimized, and rotary conveying disks of test machines have to be made thinner and thinner accordingly. Because FRP (glass fiber) is prone to curve, especially when it is thin, rotary conveying disks of chip testing machines that are made of FRP can't be formed with too big size and too small thickness otherwise they would curve to badly affect stability and efficiency of testing. But on the other hand, trenches formed on rotary conveying disks of chip testing machines shouldn't be fewer than certain number so that the machines can work with acceptable efficiency. Consequently, the problem arises that rotary conveying disks of chip testing machines have to be provided with reduced dimension due to minimization of chips while enough area of the disks have to be maintained for allowing testing operation to be highly efficient or at least with acceptable efficiency.
2. Therefore, chips with relatively small size can't be tested with the above machine if certain level of output efficiency is required; it will be difficult to maintain satisfactory efficiency when using the above conventional chip testing machine to test chips with relatively small size because a rotary conveying disk of smaller thickness and area has to be used instead.

SUMMARY OF THE INVENTION

It is a main object of the present invention to provide an additional rotary conveying disk to a chip testing machine for increasing efficiency of testing.

The chip testing machine includes a testing mechanism for acquiring data of chips and sorting same into several different groups according to outcome of the testing operation, a feeding mechanism for helping convey chips to the testing mechanism, and a first rotary conveying disk besides the additional rotary conveying disk; the conveying disks are juxtaposed, actuated to rotate synchronously in opposite directions by means of single common transmission device to receive chips conveyed from the feeding mechanism as well as to convey the chips to the testing mechanism for testing; the rotary disks cooperate with respective delivering mechanisms for conveying chips to collecting sinks designated for respective ones of the different groups of chips after the chips have been tested.

It is another object of the present invention to provide a chip testing machine, which can be used to test still smaller chips with still thinner rotary conveying disks thereof while arrangement of chip holding trenches on the rotary disks remains optimal, of which the area has to be reduced to the same degree, to which they are made thinner, and the efficiency of testing is maintained at satisfactory level.

BRIEF DESCRIPTION OF THE DRAWINGS

The present invention will be better understood by referring to the accompanying drawings, wherein.

DETAILED DESCRIPTION OF THE PREFERRED EMBODIMENTS

Figure 1:
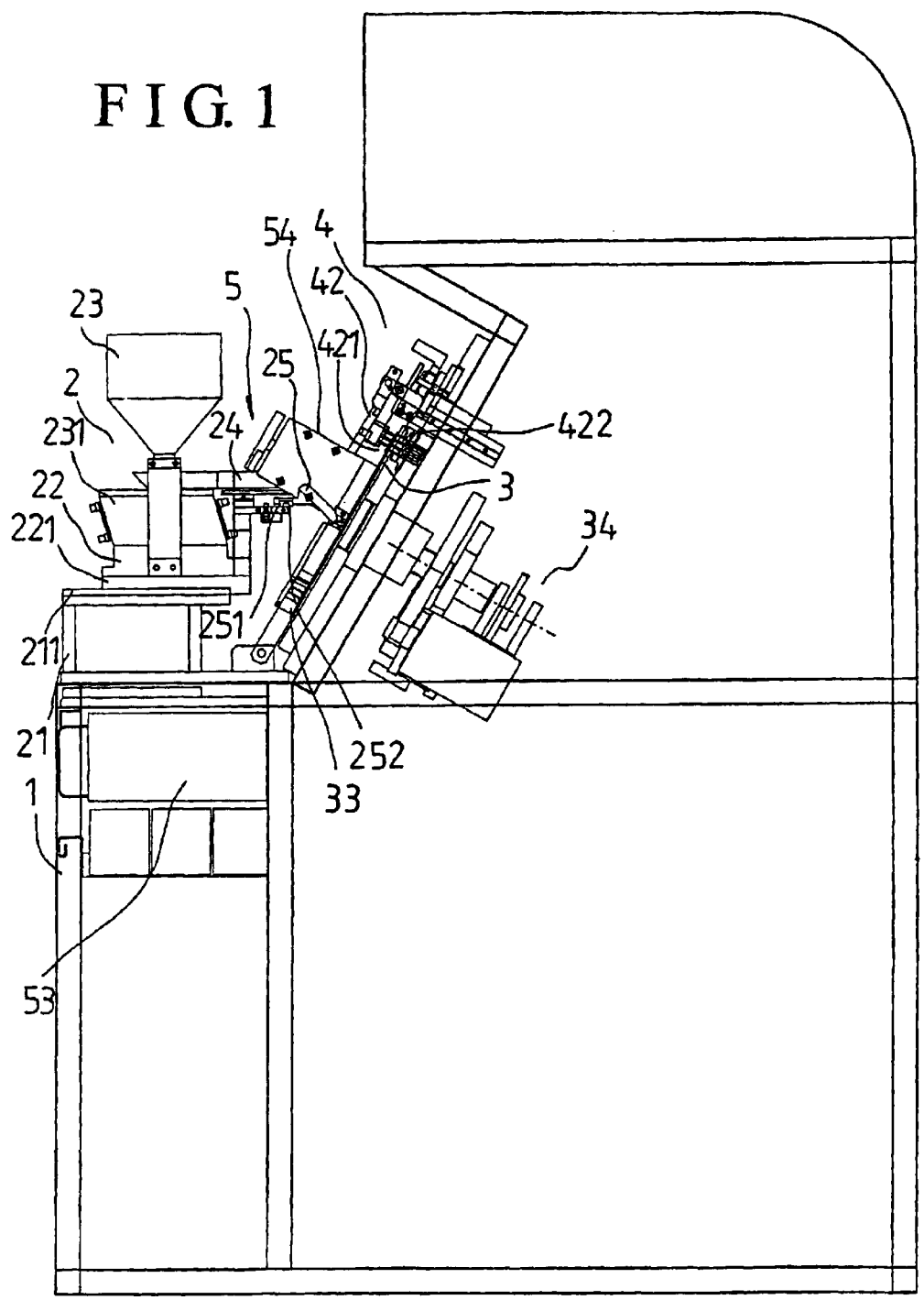
FIG. 1 is a side view of the chip testing machine according to the present invention.
Figure 2:
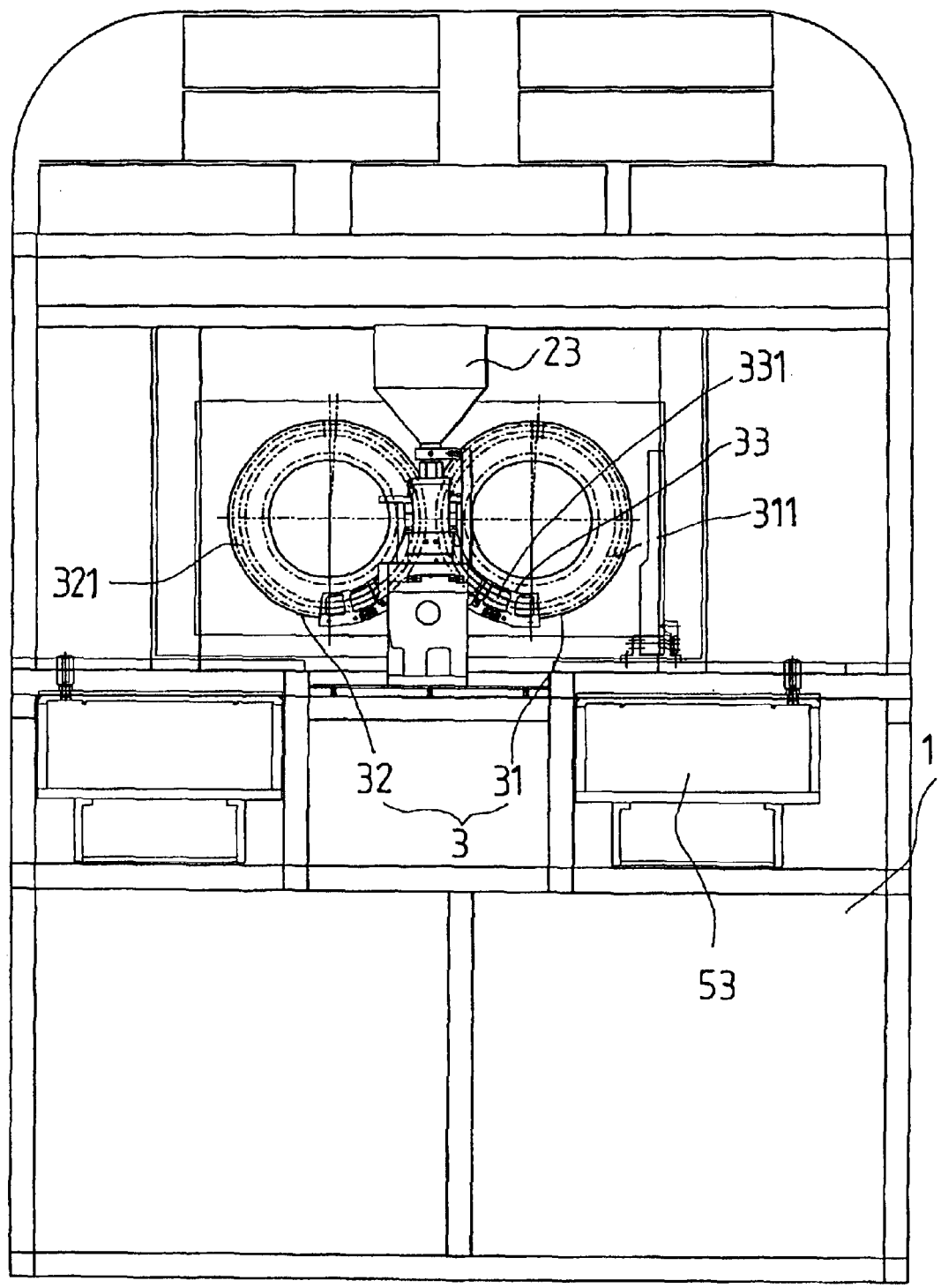
FIG. 2 is a front view of the chip testing machine according to the present invention.
Figure 3:
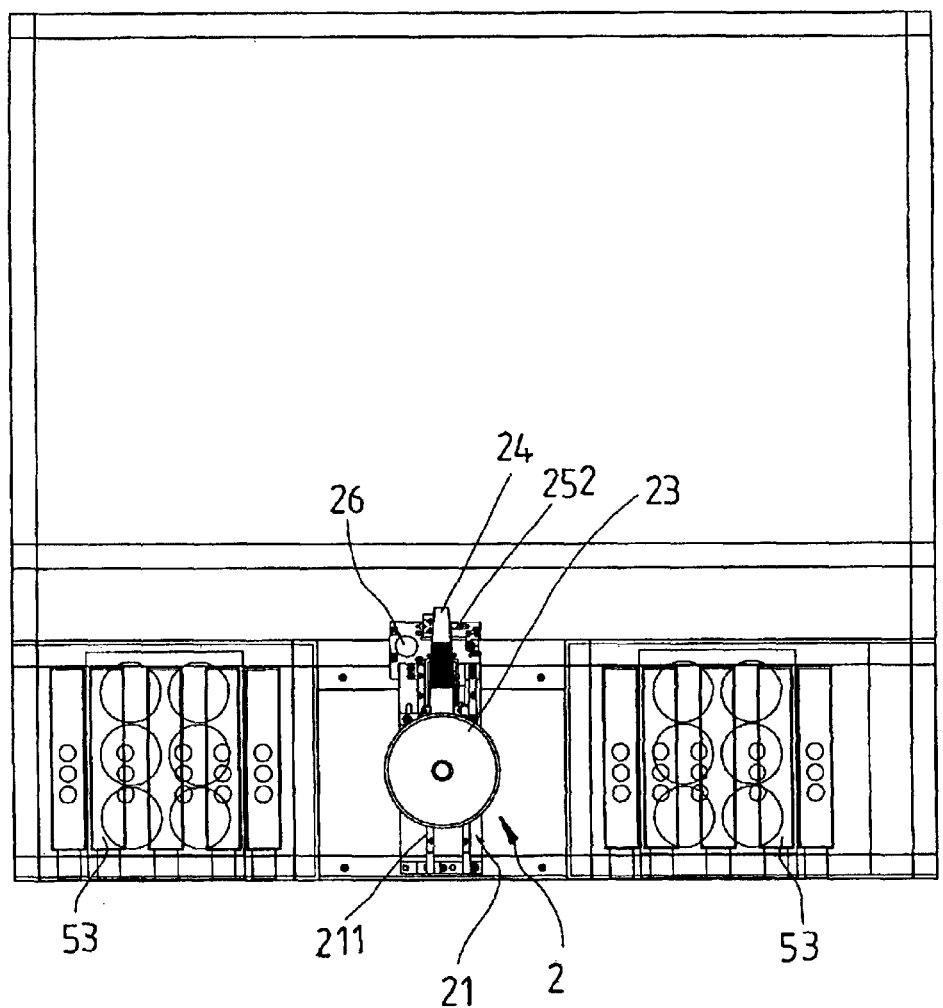
FIG. 3 is a top view of the chip testing machine according to the present invention.

Referring to FIGS. 1, 2, and 3, a preferred embodiment of a chip testing machine in the present invention includes a main shell 1, a feeding mechanism 2, a rotary conveying disk set 3, a testing mechanism 4, and a pair of delivering mechanisms 5 all fitted to the main shell 1.

Figure 4:
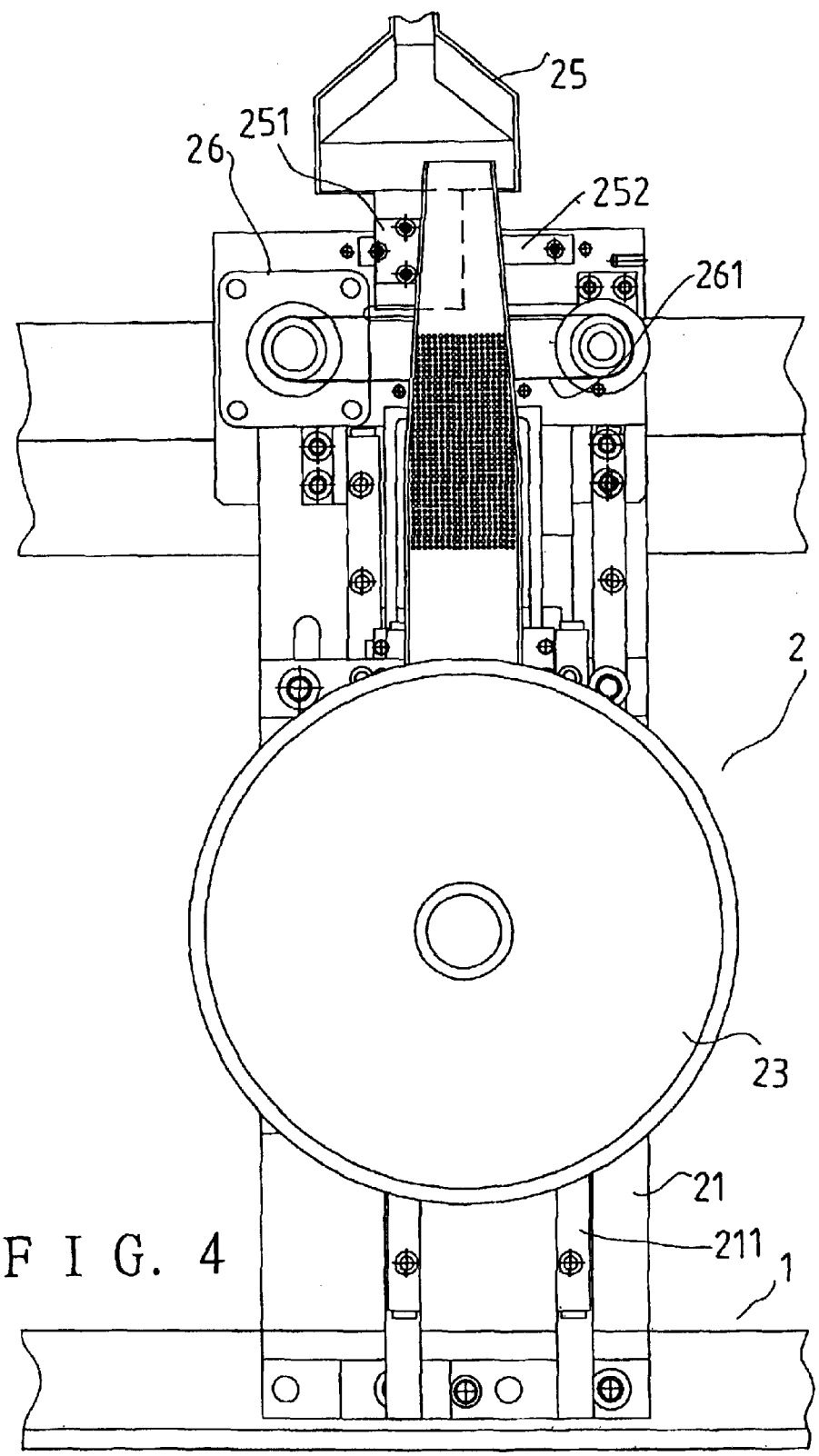
FIG. 4 is a top view of the feeding mechanism of the testing machine according to the present invention.

Referring specifically to FIGS. 1, and 4, the feeding mechanism 2 is secured in front of the rotary conveying disk set 3 on the machine shell 1 by means of a supporting element 21, and consists of a base 22, a feeding funnel 23, a vibrating conveyer 24, a distributing funnel 25, and a step-by-step motor 26; the base 22 has a sliding portion 221 on the bottom thereof, and is forwards and rearwards movable on the supporting element 21 with the sliding portion 221 being fitted to rails 211 of the supporting element 21; the feeding funnel 23 is disposed on the base 22 with an outlet thereof being arranged just above an inlet of the vibrating conveyer 24 so that chips to be tested can be conveyed to the vibrating conveyer 24 via the feeding funnel 23; a vibrating device 231 is provided, which can work to make the vibrating conveyer 24 vibrate so as to make chips move forwards along the vibrating conveyer 24. The distributing funnel 25 is disposed under an outlet of the vibrating conveyer 24, and has a sliding portion 251 on a rear end portion of the bottom thereof; the distributing funnel 25 is left and right movable on the base 22 with the sliding portion 251 being fitted to rails 252, which are secured to a front side of the base 22; the step-by-step motor 26 works together with a timing belt 261 to make the distributing funnel 25 move left and right between tops of inlets of a pair of juxtaposed rotary conveying disks 31, and 32 of the rotary conveying disk set 3.

Figure 5:
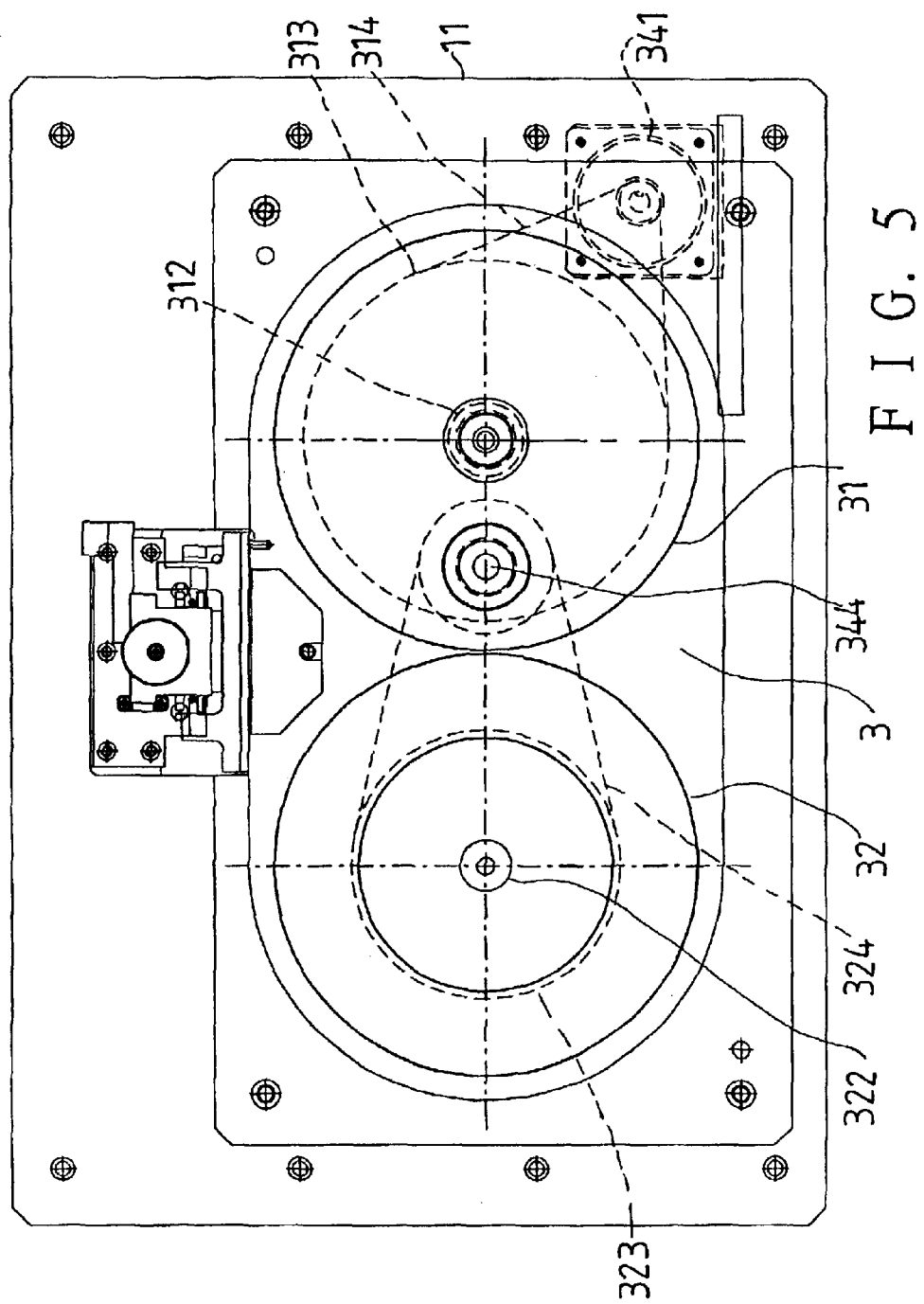
FIG. 5 is a simplified front view of the rotary conveying disk set of the testing machine according to the present invention.
Figure 6:
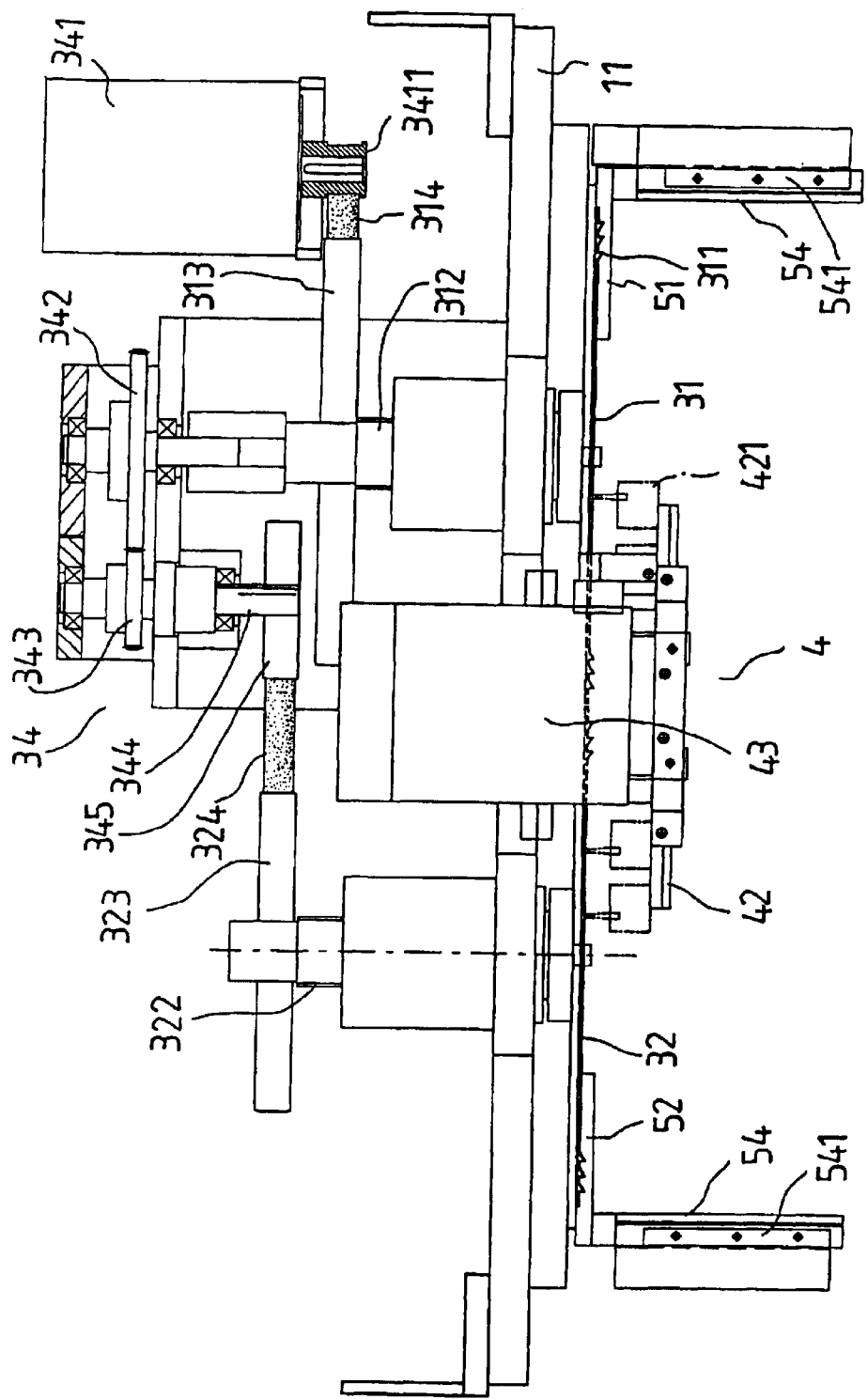
FIG. 6 is a view of the transmission mechanism of the rotary conveying disk set.
Figure 7:
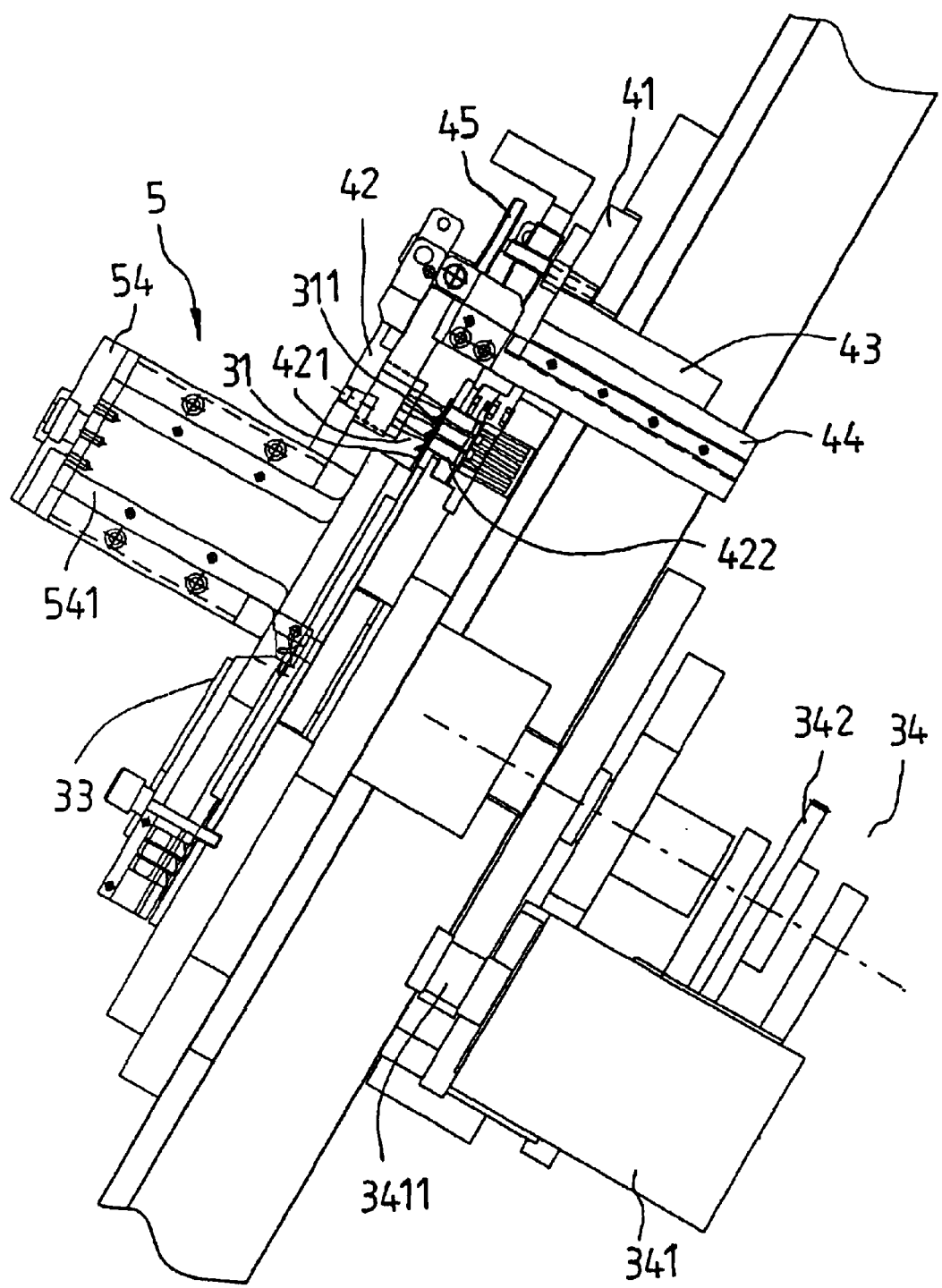
FIG. 7 is a side view of the testing mechanism and the associated parts of the testing machine according to the present invention.
Figure 8:
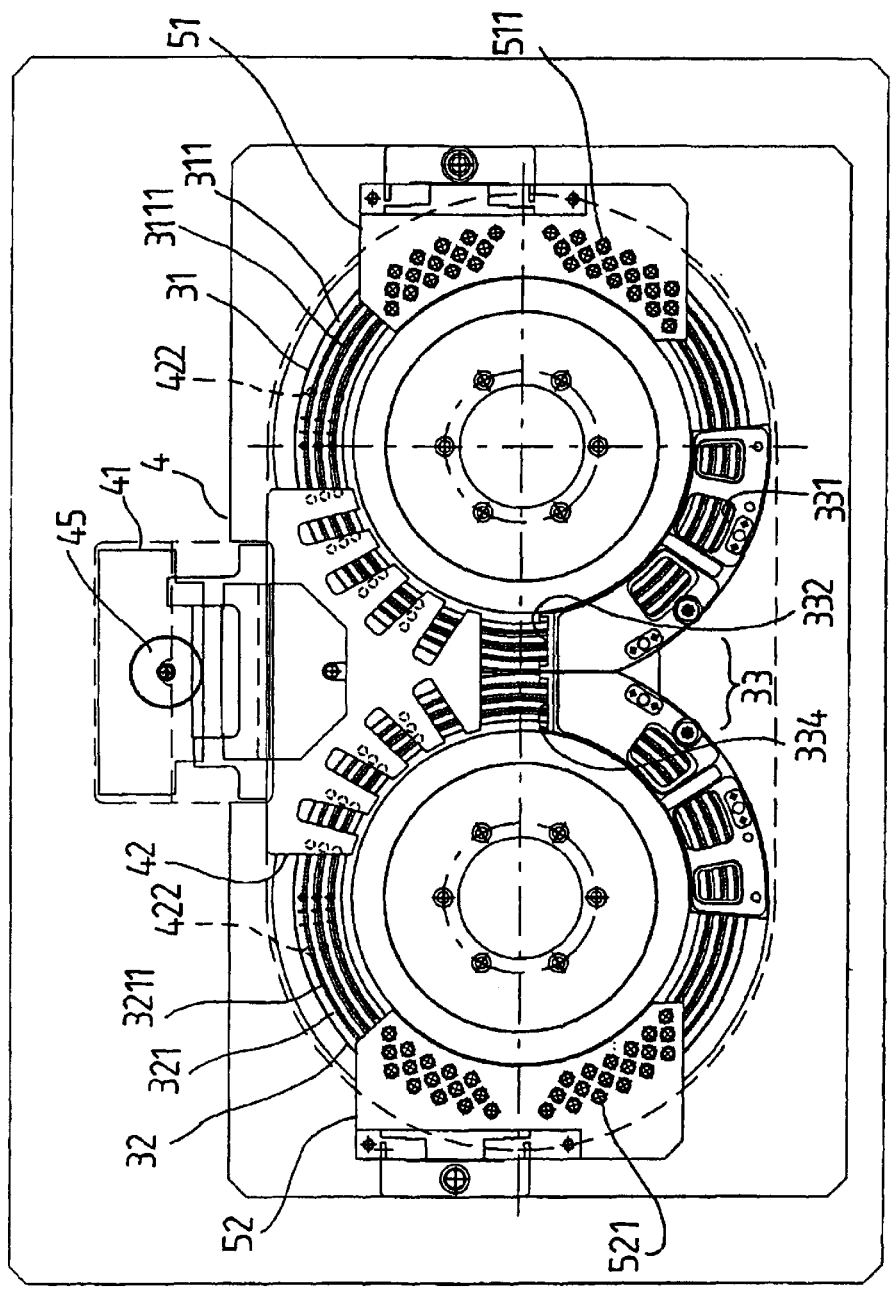
FIG. 8 is front view of the rotary conveying disk set is a simplified front view of the rotary conveying disk set of the testing machine according to the present invention.
Figure 9:
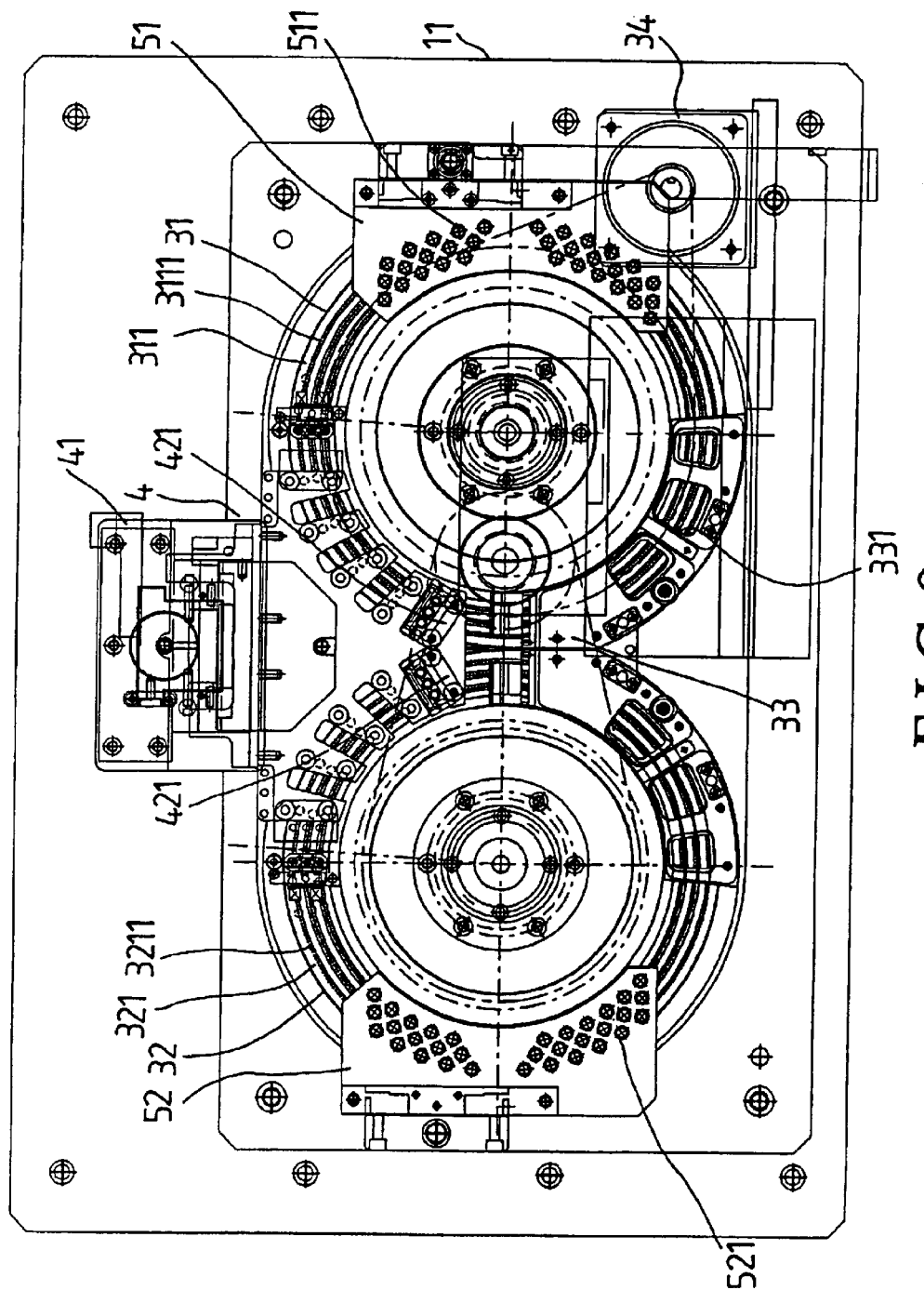
FIG. 9 is a plan view of the conveying mechanism of the testing machine according to the present invention.
Figure 10:
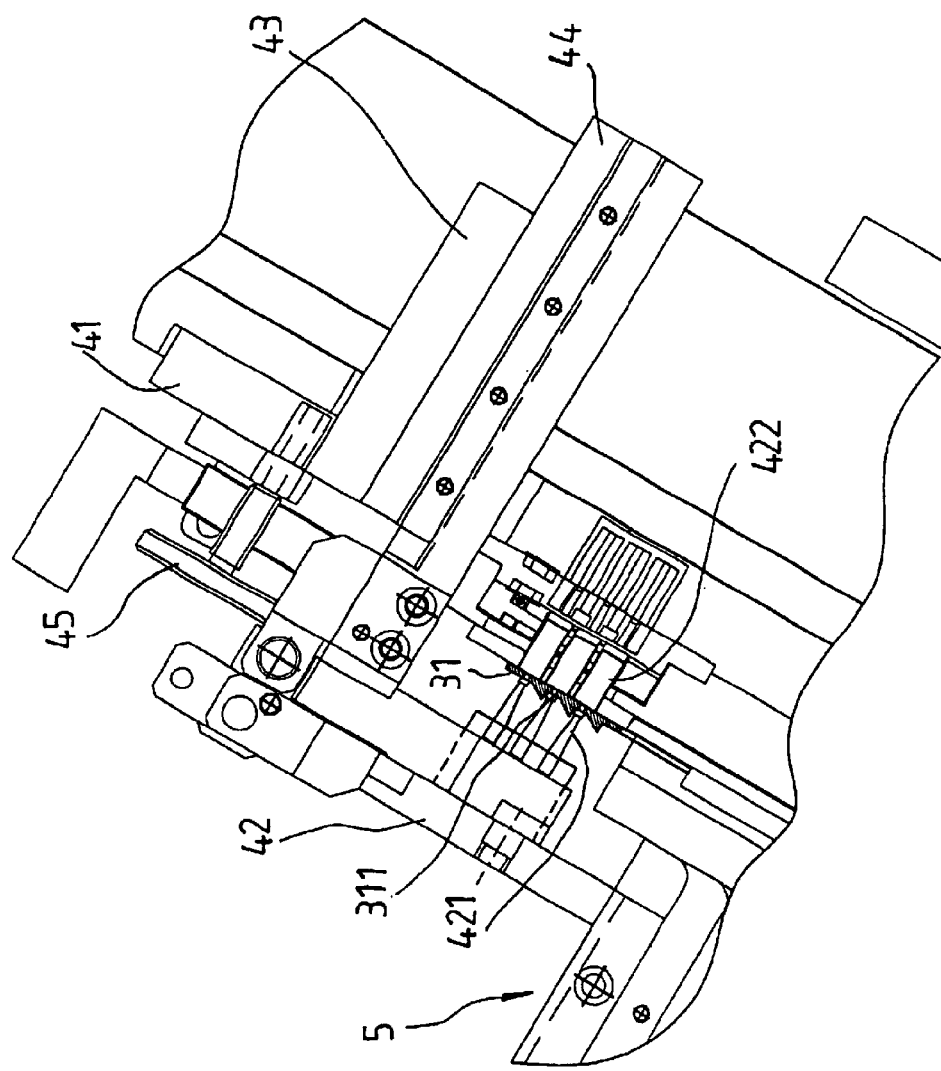
FIG. 10 is an expanded view of the delivering mechanism shown in FIG. 7.
Figure 11:
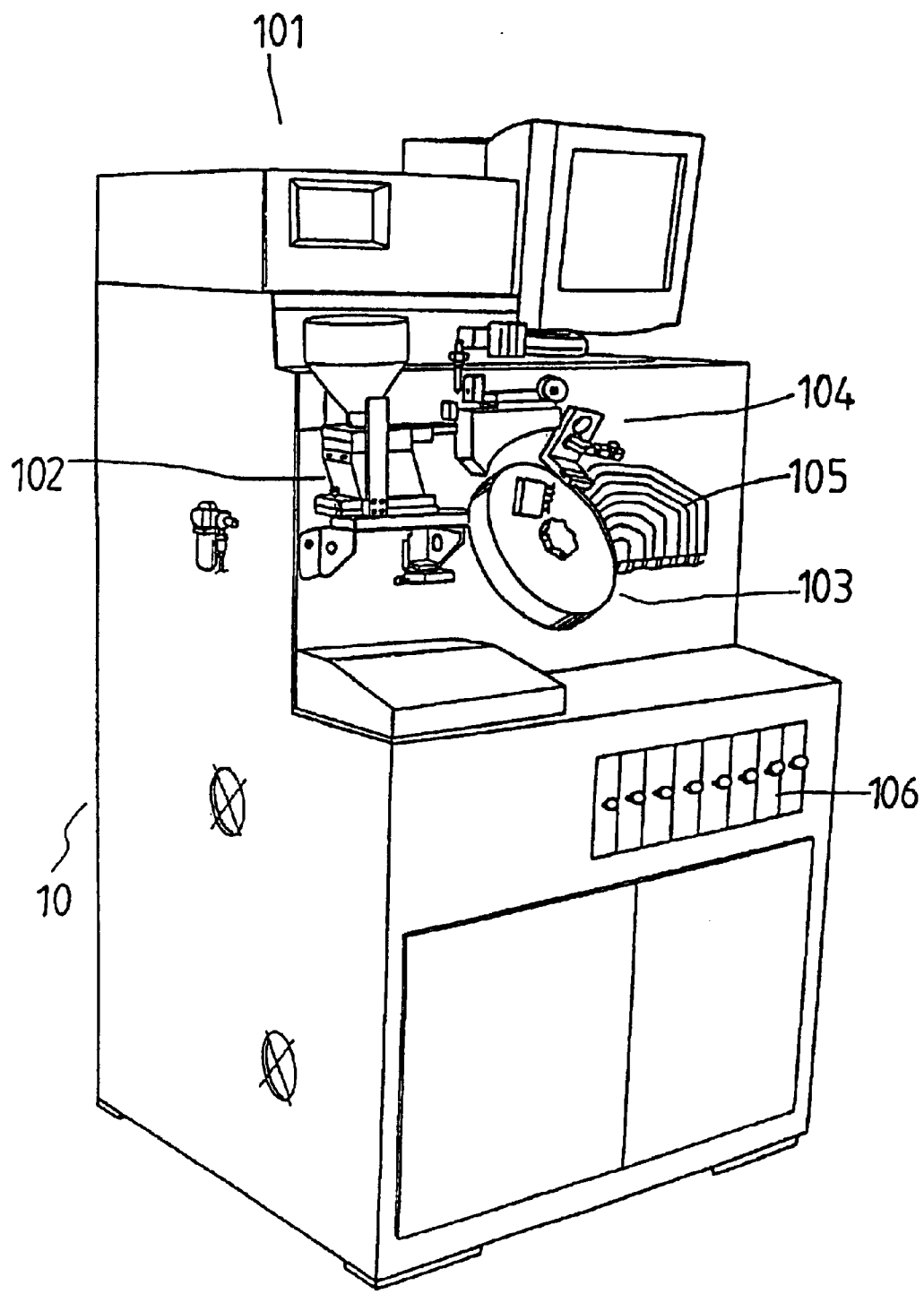
FIG. 11 is a perspective view of the conventional testing machine as described in the Background.

Referring specifically to FIGS. 5 to 7, the rotary conveying disk set 3 is disposed on a front tilted board 11 secured to the machine shell 1, and consists of a protective guiding cover 33, and a transmission device 34 besides the juxtaposed rotary conveying disks 31, and 32. The rotary conveying disks 31, and 32 are the same in structure, and are respectively arranged in right and left portions of the front tilted board 11. The rotary conveying disks 31, 32 have trenches 311, 321 thereon, and through holes 3111, 3211, which are spaced out along each of the trenches 311, 321, and form radial patterns, for allowing chips to be held therein. A protective guiding cover 33 is arranged above the rotary conveying disks 31, and 32 to cover the same, as shown in FIGS. 7, and 8; the protective guiding cover 33 is formed with several transparent observation windows 331 so that people can check whether there are chips in improper position to hinder movement of the disks 31, 32. The conveying disks 31, and 32 are formed with inlets 332, 334 opposing each other. The step-by-step motor 26 makes the distributing funnel 25 move left and right between tops of the inlets 332, 334 of the conveying disks 31, and 32 so that chips can be supplied to the trenches 311, 321, and then moved forwards with rotation of the disks 31, 32.

The transmission device 34 has a step-by-step motor 341, which can work to make the rotary conveying disks 31, and 32 rotate at the same pace. Referring specifically to FIGS. 5 to 7, the rotary conveying disk 31 has a pulley 313 securely joined to a shaft 312 thereof while the step-by-step motor 341 has a small pulley 3411; a timing belt 314 is passed over the pulley 313 and the pulley 3411. A timing gear 342 is securely joined to tail end of the shaft 312, and engages a spur gear 343, which is joined to a subsidiary shaft 344, so that rotation of the step-by-step motor 341 is transmitted to the subsidiary shaft 344 to make the same rotate in opposite direction. A pulley 345 is secured to other end of the shaft 344 while a pulley 323 is securely joined to a shaft 322 of the rotary conveying disk 32. And, a timing belt 324 is passed over the pulleys 345, and 323; thus, the step-by-step motor 341 can make the rotary conveying disks 31, and 32 rotate synchronously at the same pace and in opposite directions when activated to function.

The testing mechanism 4 is disposed above the space between the rotary conveying disks 31, and 32. Referring to FIGS. 5 to 9, the testing mechanism 4 is fitted to the machine shell 1 at a base 41 thereof, a curved plate 42 is pivoted to a bottom of the base 41, capable of being positioned right above the rotary conveying disks 31, and 32; the curved plate 42 can be moved to an opened position from a secured closed position and vice versa. A sliding member 43, rails 44, and a micro-adjuster 45 are used for precisely adjusting the curved plate 42 in respect of the distance from the same to the rotary conveying disks 31, and 32. Upper probes 421 are fitted on the curved plate 42 to face corresponding ones of the trenches 311, 321 of the rotary conveying disks 31, 32 while lower probes 422 are fitted on the machine shell 1 under the rotary conveying disks 31, 32 to face corresponding upper probes 421; thus, chips held in the trenches 311, 321 of the disks 31, 32 can be tested when the disks 31, 32 rotate to cause the chips to pass between the probes 421, 422.

The delivering mechanisms 5, 5 are arranged so as to face outward sides of corresponding disks 31, 32. Referring to FIGS. 6 to 9, the delivering mechanisms 5, 5 have covers 51, 52 respectively, which are pivoted to the machine shell 1 at the bottoms to be capable of being outwardly opened, and which are formed with through holes 511, 521 thereon; guiding pipes (not shown) are inserted through respective ones of the through holes 511, 521, and connected to respective collecting sinks 53 fitted to the machine shell 1. Movable plates 54, 54 are movably fitted on rails 541 while the covers 51, 52 of the delivering mechanisms 5, 5 are respectively securely fitted to the bottoms of the movable plates 54, 54; thus, the covers 51, 52 can be adjusted in respect of distance from them to the conveying disks 31, 32, and in turns, chips after testing can be conveyed to appropriate ones of the collecting sinks 53 according to various data related to the chips, which are acquired by means of the testing mechanism 4.

In operation of the present testing machine, chips fall into the vibrating conveyer 24 from the feeding funnel 23 of the feeding mechanism 2, and then fall onto the distributing funnel 25. Next, the step-by-step motor 26 and the timing belt 261 work together to make the distributing funnel 25 move left and right to evenly spread chips out along each trench 311, 321 of the conveying disks 31, 32 while at the same time, the step-by-step motor 341 and the associated gears of the transmission device 34 make the rotary conveying disks 31, 32 rotate synchronously and intermittently in opposite directions so that chips are moved towards the testing mechanism 4.

The chips held in the trenches 311, 321 are tested by means of the testing mechanism 4, and various data in relation to the chips are acquired, and recorded when pass between the upper and the lower probes 421, 422; the chips are also sorted into groups according to the outcome of the testing. The chips are conveyed on into appropriate collecting sinks 53 based on outcome of sorting by the testing mechanism 4 after testing. At the same time, new chips are fed to the conveying disks 31, 32, to be held in the through holes 3111, 3211 of the trenches 311, 321 by means of the distributing funnel 25 so that testing can continue.

From the above description, it can be easily understood that the chip testing machine of the present invention has advantages as followings:

1. The testing machine can perform chip testing and sorting operation with two rotary conveying disks being actuated by single step-by-step motor, with chips being supplied by means of single feeding mechanism, and with chips being tested by means of single testing mechanism. Therefore, the testing machine is virtually twice as efficient as one equipped with single conveying disk. And, additional cost for doubling the efficiency is relatively low because each of the main mechanisms of the present machine remains single except for the rotary conveying disks, i.e. the present machine is more economical to use.
2. The problem of conveying disks being prone to change shape, especially when formed with too big area and tool small thickness, and the problem in chip testing resulting from tendency of minimizing size of chips as described in the Background can be handled with the present testing machine because it is equipped with two rotary conveying disks instead of one, i.e. the fact that one more conveying disk is provided to the testing machine makes it possible to maintain proper ratio of the thickness of each disk to the area of the disk, preventing the disks from changing shape, while the efficiency of testing is not reduced but increased.
3. For the same reason as the above, the present testing machine can be used to test still smaller chips with still thinner rotary conveying disks thereof while arrangement of chip holding trenches on the rotary disks remains optimal, of which the area has to be reduced to the same degree, to which they are made thinner, and the efficiency of testing is maintained at high level.

What is claimed is:

1. A chip testing machine, comprising:

a testing mechanism having a plurality of pairs of upper and lower probes for contacting chips, the testing mechanism acquiring data of chips in a testing operation and sorting the chips into a plurality of different groups according to a corresponding outcome of the testing operation;

a feeding mechanism for helping convey chips to the testing mechanism; and a rotary conveying disk set for receiving chips from the feeding mechanism and conveying the chips to the testing mechanism, the rotary conveying disk set including a plurality of spaced rotary conveying disks, the rotary conveying disks being actuated to rotate synchronously by means of single transmission device to receive chips conveyed from the feeding mechanism as well as to convey chips to the testing mechanism for testing, each rotary conveying disk having a first pulley securely joined to a shaft thereof, the transmission device for the rotary conveying disks including (a) a step-by-step motor having a second pulley, (b) a first timing belt being passed over the first pulley of a first one of the conveying disks and the second pulley, (c) a timing gear securely joined to a tail end of the shaft of the first conveying disk and engaging a spur gear joined to a subsidiary shaft, (d) a third pulley being secured to the subsidiary shaft; a second timing belt being passed over the third pulley and the first pulley of a second one of the conveying disks.

2. The chip testing machine as claimed in claim 1, wherein the rotary conveying disks are provided with a common protective guiding cover arranged above them.

3. The chip testing machine as claimed in claim 2, wherein the protective guiding cover is formed with a plurality of observation windows.

* * * * *